(12) United States Patent
Kim et al.

(10) Patent No.: US 8,803,155 B2
(45) Date of Patent: Aug. 12, 2014

(54) THIN-FILM TRANSISTOR SENSOR AND METHOD OF MANUFACTURING THE TFT SENSOR

(75) Inventors: Mu-Gyeom Kim, Yongin (KR); Chang-Mo Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 7 days.

(21) Appl. No.: 13/185,630

(22) Filed: Jul. 19, 2011

(65) Prior Publication Data

US 2012/0025194 A1 Feb. 2, 2012

(30) Foreign Application Priority Data

Jul. 27, 2010 (KR) .................. 10-2010-0072479

(51) Int. Cl.
*H01L 29/10* (2006.01)

(52) U.S. Cl.
USPC .......... 257/60; 257/66; 257/E29.275; 257/76; 257/E29.003; 257/E29.273; 257/E21.414; 257/59; 257/43; 438/157; 438/158; 438/166; 438/487; 438/795; 438/104; 345/173; 178/18.01; 349/12; 349/47

(58) Field of Classification Search
USPC ............... 257/60, 66, E29.003, E29.273, 257/E21.414, 59, 43, 76, E29.275; 438/158, 166, 487, 795, 104, 157; 349/12, 47; 345/173; 178/18.01
See application file for complete search history.

(56) References Cited

U.S. PATENT DOCUMENTS

| 5,929,449 | A | * | 7/1999 | Huang | .................. 250/370.09 |
| 6,388,279 | B1 | | 5/2002 | Sakai et al. | |
| 7,601,595 | B2 | | 10/2009 | Forbes | |
| 2003/0219935 | A1 | * | 11/2003 | Miyairi et al. | ................ 438/166 |
| 2005/0285108 | A1 | * | 12/2005 | Choi | ................ 257/59 |
| 2007/0057256 | A1 | * | 3/2007 | Hara et al. | ................ 257/59 |
| 2009/0191677 | A1 | | 7/2009 | Forbes | |
| 2009/0321731 | A1 | * | 12/2009 | Jeong et al. | ................ 257/43 |
| 2010/0026639 | A1 | * | 2/2010 | Lee et al. | ................ 345/173 |

FOREIGN PATENT DOCUMENTS

| JP | 2007-178256 A | 7/2007 |
| JP | 2009-135260 A | 6/2009 |
| KR | 10-0155306 B1 | 7/1998 |
| KR | 10-2000-0062752 A | 10/2000 |

(Continued)

OTHER PUBLICATIONS

Korean Notice of Allowance in KR 10-2010-0072479, dated Dec. 27, 2011 (Kim, et al.).

(Continued)

*Primary Examiner* — Meiya Li
*Assistant Examiner* — Lauren R Bell
(74) *Attorney, Agent, or Firm* — Lee & Morse, P.C.

(57) ABSTRACT

According to an aspect of the present invention, there is provided a thin-film transistor (TFT) sensor, including a bottom gate electrode on a substrate, an insulation layer on the bottom gate electrode, an active layer in a donut shape on the insulation layer, the active layer including a channel through which a current generated by a charged body flows, an etch stop layer on the active layer, the etch stop layer including a first contact hole and a second contact hole, and a source electrode and a drain electrode burying the first and second contact holes, the source and drain electrodes being disposed on the etch stop layer so as to face each other.

17 Claims, 21 Drawing Sheets

(56) References Cited

FOREIGN PATENT DOCUMENTS

| KR | 10 2007-0003228 A | 1/2007 |
| KR | 10-2007-0022165 A | 2/2007 |
| KR | 10-0941996 B1 | 2/2010 |

OTHER PUBLICATIONS

Korean Office Action in KR 10-2010-0072479, dated Sep. 28, 2011 (Kim, et al.).

* cited by examiner

THIN-FILM TRANSISTOR SENSOR AND METHOD OF MANUFACTURING THE TFT SENSOR

BACKGROUND

1. Field

The present invention relates to thin-film transistors (TFTs), and more particularly, to a TFT sensor having an oxide semiconductor layer as an active layer.

2. Description of the Related Art

Performance of a thin-film transistor (TFT) greatly depends on the material and state of an active layer in which a channel, through which charge carriers move, is formed.

In the case of TFTs having an active layer formed of amorphous silicon (hereinafter, referred to as an amorphous silicon TFT), charge mobility is very low, namely, about 0.5 $cm^2/Vs$.

In the case of TFTs having an active layer formed of polycrystalline silicon (hereinafter, referred to as polycrystalline silicon TFTs), a crystallization process, an impurity-implantation process, an activation process, etc. are required, and thus a manufacturing process thereof is complicated and a manufacturing cost thereof is high, compared to amorphous silicon TFTs.

SUMMARY

The present invention provides a thin-film transistor (TFT) sensor capable of stably detecting a touch intensity and a touch direction of a charged body.

According to an aspect of the present invention, there is provided a thin-film transistor (TFT) sensor, including a bottom gate electrode on a substrate, an insulation layer on the bottom gate electrode, an active layer in a donut shape on the insulation layer, the active layer including a channel through which a current generated by a charged body flows, an etch stop layer on the active layer, the etch stop layer including a first contact hole and a second contact hole, and a source electrode and a drain electrode burying the first and second contact holes, the source and drain electrodes being disposed on the etch stop layer so as to face each other.

The active layer may have a generally square or rectangular donut shape, and the first and second contact holes may be disposed on corner areas of the active layer so as to diagonally face each other.

The first and second contact holes may be formed on edges of the active layer so as to face each other.

The TFT sensor may further including a first top gate electrode and a second top gate electrode on the etch stop layer, the first and second top gate electrodes being on a same level as the source and drain electrodes without contacting the source and drain electrodes, the first and second top gate electrodes facing each other.

A direction of current flowing in the channel may be controlled by applying a periodically-swinging voltage to the first and second top gate electrodes.

The active layer may include a hole at the center of the active layer, and the channel may be divided into channels by the hole.

A touch direction and a touch intensity of the charged body may be sensed based on the amounts of currents flowing through the channels into which the channel is divided.

The active layer may include an oxide semiconductor.

The bottom gate electrode may include a first bottom gate electrode and a second bottom gate electrode that correspond to edges of the active layer, the first and second bottom gate electrodes being a predetermined distance apart from each other and disposed so as to face each other.

The direction of current flowing in the channel may be controlled by applying a periodically-swinging voltage to the first and second bottom gate electrodes.

According to another aspect of the present invention, there is provided a thin-film transistor (TFT) sensor, including a bottom gate electrode on a substrate, an insulation layer on the bottom gate electrode, an active layer in a donut shape on the insulation layer, the active layer including a hole for channel separation at the center of the active layer, an etch stop layer on the active layer, the etch stop layer including a first contact hole and a second contact hole, and an electrode layer on the etch stop layer corresponding to areas of edges of the active layer.

The active layer may have a generally square or rectangular donut shape having four corners, the first and second contact holes may be symmetrically disposed on two corners, diagonally facing each other, from among the four corners of the active layer, and the electrode layer may include a source electrode and a drain electrode that bury the first and second contact holes and are symmetrically disposed on the two corners, and a first top gate electrode and a second top gate electrode that are symmetrically disposed at the two remaining corners without contacting the source and drain electrodes.

The direction of current flowing in the channel may be controlled by applying a periodically-swinging voltage to the first and second top gate electrodes.

The active layer may have four edges, the first and second contact holes may be symmetrically disposed on two edges, facing each other, from among the four edges of the active layer, and the electrode layer may include a source electrode and a drain electrode that bury the first and second contact holes and are symmetrically disposed on the two edges, and a first top gate electrode and a second top gate electrode that are symmetrically disposed on the two remaining edges without contacting the source and drain electrodes.

The active layer may include an oxide semiconductor.

The active layer may include at least one material selected from the group of In, Ga, Zn, Sn, Sb, Ge, Hf, Al, and As.

The active layer may be square or rectangular.

According to another aspect of the present invention, there is provided a thin-film transistor (TFT) sensor, including a first bottom gate electrode and a second bottom gate electrode separated from each other by a predetermined distance on a substrate, an insulation layer on the first and second bottom gate electrodes, an active layer in a donut shape on the insulation layer, the active layer including a hole for channel separation at the center of the active layer, an etch stop layer on the active layer, the etch stop layer including a first contact hole and a second contact hole, and a source electrode and a drain electrode burying the first and second contact holes, the source and drain electrodes being disposed on the etch stop layer so as to face each other.

The active layer may have four edges, the first and second contact holes may be symmetrically disposed on two edges, facing each other, from among the four edges of the active layer, and the source and drain electrodes may bury the first and second contact holes and are symmetrically disposed on the two edges, and the first and second bottom gate electrodes are symmetrically formed on the two remaining edges.

The active layer may include an oxide semiconductor.

The active layer may include at least one material selected from the group of In, Ga, Zn, Sn, Sb, Ge, Hf, and As.

The direction of current flowing in the channel may be controlled by applying a periodically-swinging voltage to the first and second bottom gate electrodes.

The active layer may be square or rectangular.

According to another aspect of the present invention, there is provided a thin-film transistor (TFT) sensor array including TFT sensors arranged by rotating a TFT sensor by a predetermined angle, wherein each of the TFT sensors includes a bottom gate electrode on a substrate, an insulation layer on the bottom gate electrode, an active layer in a donut shape on the insulation layer, the active layer including a hole for channel separation at the center of the active layer, an etch stop layer on the active layer, the etch stop layer including a first contact hole and a second contact hole, a source electrode and a drain electrode burying the first and second contact holes, the source and drain electrodes being disposed on the etch stop layer so as to face each other, and a first top gate electrode and a second top gate electrode, the first and second top gate electrodes being disposed on the etch stop layer so as to face each other.

The TFT sensor array may include four TFT sensors arranged by rotating a TFT sensor at intervals of 90 degrees.

According to another aspect of the present invention, there is provided a thin-film transistor (TFT) sensor array including TFT sensors arranged by rotating a TFT sensor by a predetermined angle, wherein each of the TFT sensors includes a first bottom gate electrode and a second bottom gate electrode separated from each other by a predetermined distance on a substrate, an insulation layer on the first and second bottom gate electrodes, an active layer in a donut shape on the insulation layer, the active layer including a hole for channel separation at the center of the active layer, an etch stop layer on the active layer, the etch stop layer including a first contact hole and a second contact hole, and a source electrode and a drain electrode burying the first and second contact holes, the source and drain electrodes being disposed on the etch stop layer so as to face each other.

The TFT sensor array may include four TFT sensors arranged by rotating a TFT sensor by 90 degrees at a time.

The TFT sensor array may include four TFT sensors arranged by rotating each of two TFT sensors by 90 degrees.

According to another aspect of the present invention, there is provided a method of manufacturing a thin-film transistor (TFT) sensor, the method including forming a bottom gate electrode on a substrate, forming an insulation layer on the bottom gate electrode, forming an active layer that has a donut shape and a hole for channel separation at the center of the active layer, the active layer being formed on the insulation layer, forming an etch stop layer having a first contact hole and a second contact hole, the etch stop layer being formed on the active layer, and forming a source electrode and a drain electrode that bury the first and second contact holes and face each other, the source and drain electrodes being formed on the etch stop layer.

The active layer may be formed to have a generally square or rectangular donut shape, and the first and second contact holes may be formed on corner areas of the active layer so as to diagonally face each other.

The first and second contact holes may be formed on edges of the active layer so as to face each other.

The method may further include forming a first top gate electrode and a second top gate electrode on the etch stop layer on the same level as the source and drain electrodes without contacting the source and drain electrodes, so as to face each other, simultaneously with the forming of the source and drain electrodes.

Forming the bottom gate electrode may include forming a first bottom gate electrode and a second bottom gate electrode that are a predetermined distance apart from each other and face each other, the first and second bottom gate electrodes corresponding to areas of the active layer.

The active layer may include an oxide semiconductor.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
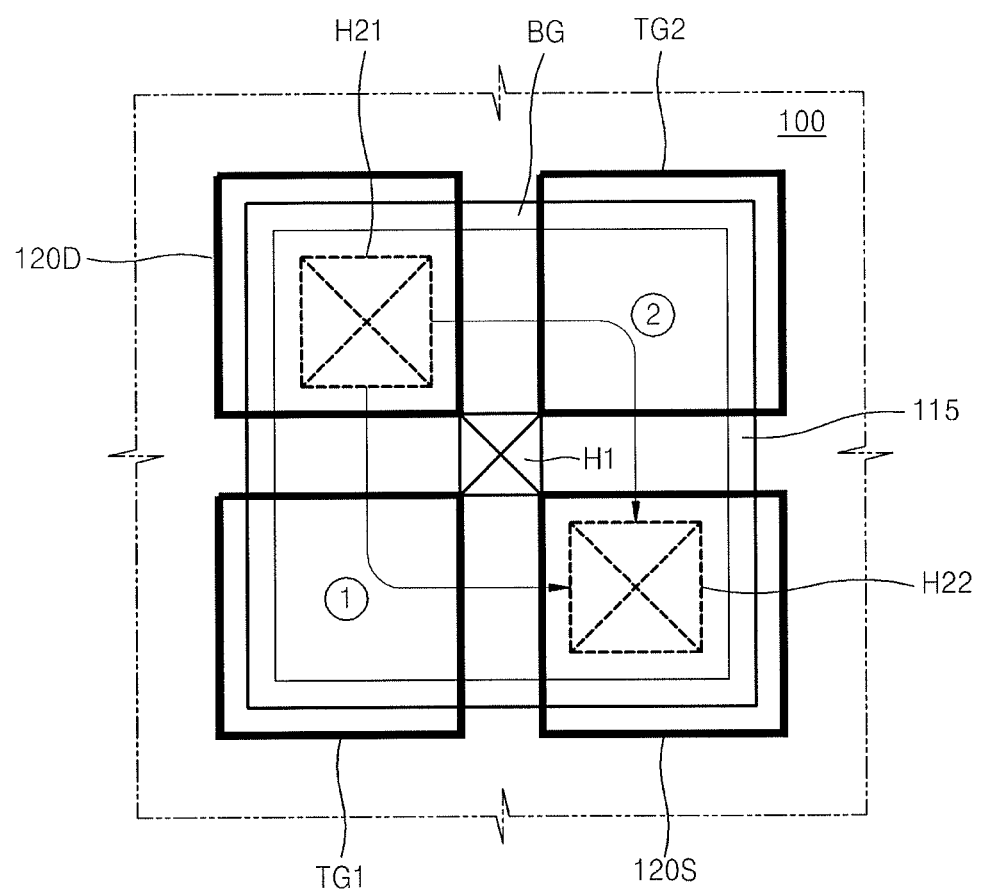
FIG. 1 illustrates a plan view of a thin-film transistor (TFT) sensor according to an embodiment of the present invention.

Korean Patent Application No. 10-2010-0072479, filed on Jul. 27, 2010, in the Korean Intellectual Property Office, and entitled: "Thin-Film Transistor Sensor and Method of Manufacturing the TFT Sensor," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the description of the present invention, if it is determined that a detailed description of commonly-used technologies or structures related to the invention may unnecessarily obscure the subject matter of the invention, the detailed description will be omitted.

FIG. 1 is a plan view of a thin-film transistor (TFT) sensor according to an embodiment of the present invention.

Referring to FIG. 1, the TFT sensor includes an integrated-type bottom gate electrode and a separated-type top gate electrode. The TFT sensor includes a bottom gate electrode BG. The TFT sensor also includes, on the bottom gate electrode BG, a first top gate electrode TG1, a second top gate electrode TG2, a drain electrode 120D, and a source electrode 120S on the same plane.

The bottom gate electrode BG is square and formed on a substrate 100. The bottom gate electrode BG controls a current flowing in a channel formed in an active layer 115. The active layer 115 has a square donut shape, has a separation hole H1 for channel separation, and is formed on the bottom gate electrode BG. The separation hole H1 is located at the center of the active layer 115, and the active layer 115 is formed of oxide semiconductor.

The size of the separation hole H1 may depend on a static resolving power and a direction sensing performance of the TFT sensor. When the separation hole H1 is bigger, the static resolving power decreases, whereas the direction sensing performance improves. Otherwise, the static resolving power increases, whereas the direction sensing performance degrades.

A drain region and a source region of the active layer 115 contact the drain electrode 120D and the source electrode 120S via first and second contact holes H21 and H22, respectively. The drain electrode 120D and the source electrode 120S are formed on two corner areas diagonally facing each other from among the four corner areas of the square active layer 115. The first top gate electrode TG1 and the second top gate electrode TG2 are formed on the two remaining corner areas diagonally facing each other on the same level as the drain electrode 120D and the source electrode 120S.

Figure 2A:
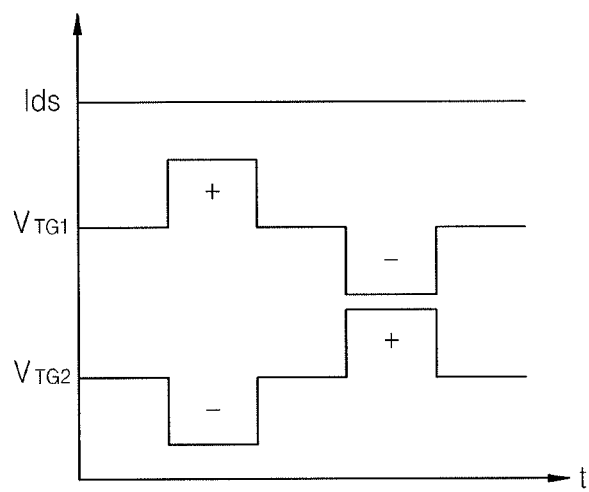
FIGS. 2A and 2B illustrate graphs for explaining a method of driving the TFT sensor illustrated in FIG. 1.
Figure 2B:
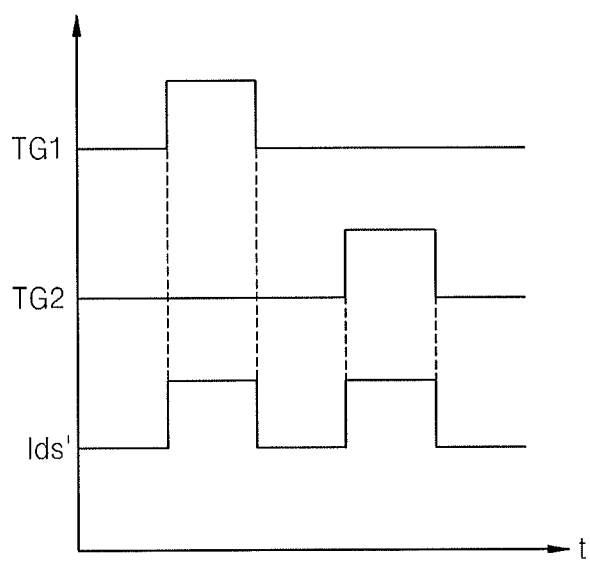

Because of the separation hole H1, a current Ids flowing from the drain electrode 120D to the source electrode 120S may flow through a first channel passing through the first top gate electrode TG1 and a second channel 0 passing through the second top gate electrode TG2. FIGS. 2A and 2B are graphs for explaining a method of driving the TFT sensor illustrated in FIG. 1.

Referring to FIG. 2A, when a voltage is applied to the bottom gate electrode BG of the TFT sensor, voltages having different polarities are periodically applied to the first top gate electrode TG1 and the second top gate electrode TG2. At this time, the amount of a sum of current flowing through the first channel ① and current flowing through the second channel ②, namely, a total current Ids, is constant regardless of the time.

When a negative voltage is applied to a top gate electrode TG, a channel narrows, and thus a current flowing through the channel decreases. When a positive voltage is applied to the top gate electrode TG, the channel widens, and thus the current flowing through the channel increases. Accordingly, the current flowing in the channel may be controlled using the polarity of a voltage applied to the top gate electrode TG. Thus, the directions of currents flowing through two channels may be controlled.

For example, when a positive voltage is applied to the first top gate electrode TG1 and a negative voltage is applied to the second top gate electrode TG2, most current flows through the first channel ①. On the other hand, when a negative voltage is applied to the first top gate electrode TG1 and a positive voltage is applied to the second top gate electrode TG2, most current flows through the second channel ②. In other words, the amount of total current Ids is constant, and the direction of current may be controlled by changing the amounts of currents flowing through the two channels.

Referring to FIG. 2B, the first top gate electrode TG1 and the second top gate electrode TG2 allow currents to flow through the first channel ① and the second channel ②, respectively, at different points in time. When there is surface charge due to contact or non-contact of an external charged body, the amount of current flowing through the channel of the active layer 115 varies.

For example, when contact or non-contact of the external charged body occurs near the first top gate electrode TG1, current flowing through the first channel ① increases (Ids') at the moment when the first top gate electrode TG1 is open. When contact or non-contact of the external charged body occurs near the second top gate electrode TG2, current flowing through the second channel ② increases (Ids') at the moment when the second top gate electrode TG2 is open. Accordingly, it is known from the amount of current increasing at time intervals that the external charged body has moved from the vicinity of the first top gate electrode TG1 to the vicinity of the second top gate electrode TG2. In other words, the moving direction (or touch direction) of the external charged body may be determined from a difference between the amounts of currents flowing through the first and second channels, and a charge intensity (or a touch intensity) of the external charged body may be determined from the amounts of the currents.

FIGS. 3A through 6B are perspective views and cross-sectional views for explaining a method of manufacturing the TFT sensor illustrated in FIG. 1.

Figure 3A:
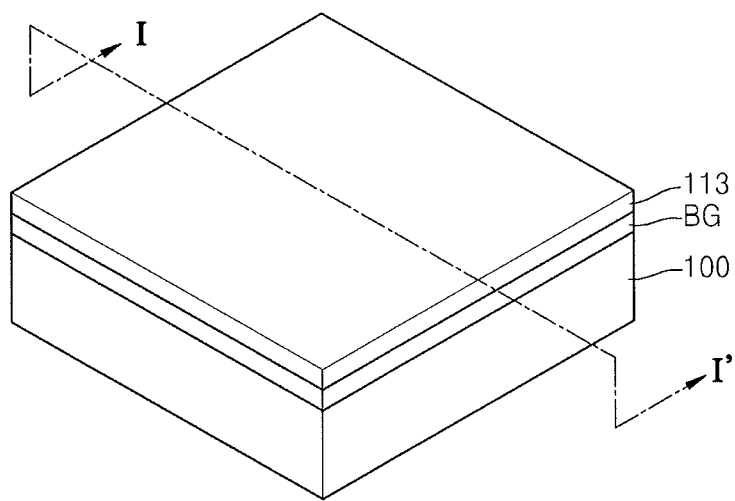
FIGS. 3A through 6B illustrate perspective views and cross-sectional views for explaining a method of manufacturing the TFT sensor illustrated in FIG. 1.
Figure 3B:
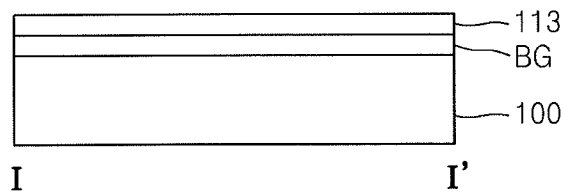

Referring to FIGS. 3A and 3B, the bottom gate electrode BG is formed on the substrate 100.

The substrate 100 may be formed of a transparent glass material mainly including $SiO_2$. The substrate 100 may also be formed of a plastic material. The substrate 100 may include a metal foil, a flexible substrate, etc.

Before the bottom gate electrode BG is formed, a buffer layer (not shown) may be formed on the substrate 100. The buffer layer may block impurities of the substrate 100 from penetrating into layers stacked on the substrate 100. The buffer layer may include, e.g., $SiO_2$ and/or $SiN_x$.

The bottom gate electrode BG is formed by forming a metal layer on the substrate 100 and patterning the metal layer to have a square shape. Although the metal layer of the bottom gate electrode BG may be formed of a metal or a metal alloy such as Au, Ag, Cu, Ni, Pt, Pd, Al, Mo, W, Ti, an Al:Nd alloy, or a Mo:W alloy, the present invention is not limited thereto, and other various materials may be used in consideration of adhesion of the bottom gate electrode BG with a neighboring layer, the flatness of the stacked layers, electric resistance, processability, and the like.

A gate insulation layer 113 is formed on the substrate 100 on which the bottom gate electrode BG has been formed. The gate insulation layer 113 may be formed of an insulative material such as silicon oxide ($SiO_x$) or silicon nitride ($SiN_x$). For example, the gate insulation layer 113 may be a tetraethyl orthosilicate (TEOS) oxide layer. The gate insulation layer 113 may also be formed of an insulative organic material or the like.

Figure 4A:
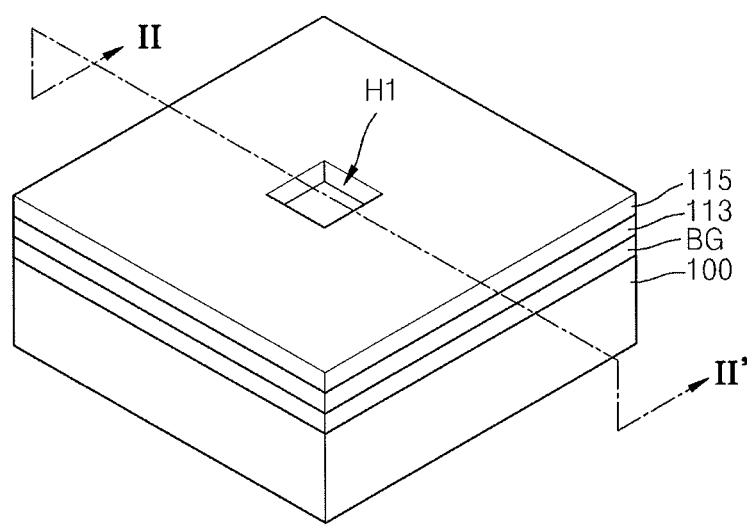
Figure 4B:
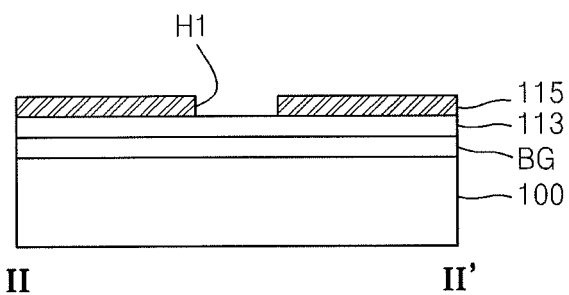

Referring to FIGS. 4A and 4B, the active layer 115 is formed on the substrate 100 on which the gate insulation layer 113 has been formed.

The active layer 115 may include an oxide semiconductor including at least one element selected from the group consisting of In, Ga, Zn, Sn, Sb, Ge, Hf, Al, and As. For example, the oxide semiconductor may include at least one selected from the group consisting of ZnO, $SnO_2$, $In_2O_3$, $Zn_2SnO_4$, $Ga_2O_3$, and $HfO_2$. The active layer 115 may be formed of transparent oxide semiconductor. Examples of the transparent oxide semiconductor may include Zinc Oxide, Tin Oxide, Ga—In—Zn Oxide, In—Zn Oxide, In—Sn Oxide, and the like, and the present invention is not limited thereto.

The active layer 115 may be formed by sputtering, which is a physical deposition method. The active layer 115 may be formed by controlling the flux of oxygen according to a resistance required by the TFT sensor. The active layer 115 is formed by forming an oxide semiconductor layer on the gate insulation layer 113 and patterning the oxide semiconductor layer to have a square shape corresponding to the bottom gate electrode BG.

The separation hole H1 is formed at the center of the active layer 115 so as to expose a portion of the gate insulation layer 113. The active layer 115 has a square donut shape because of the separation hole H1. The separation hole H1 may penetrate from the gate insulation layer 113 to the bottom gate electrode BG.

Figure 5A:
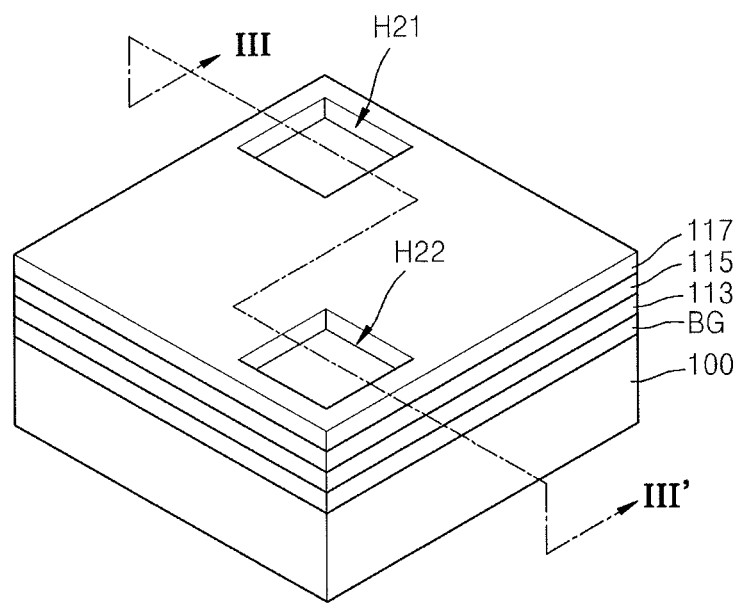
Figure 5B:
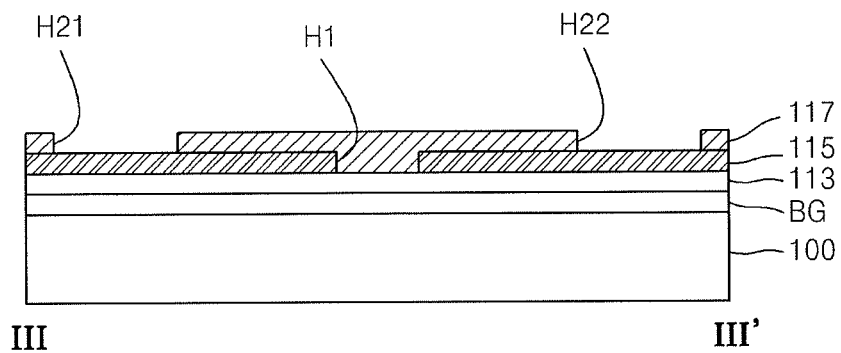

Referring to FIGS. 5A and 5B, an etch stop layer 117 is formed on the substrate 100 on which the active layer 115 has been formed.

The etch stop layer 117 may be formed of an insulative material such as $SiO_x$ or $SiN_x$, but the present invention is not limited thereto. The etch stop layer 117 may be formed by low-temperature chemical vapor deposition (CVD).

The etch stop layer 117 buries the separation hole H1 of the active layer 115. The etch stop layer 117 includes the first and second contact holes H21 and H22 formed in two of the four corner areas of the square active layer 115 so as to be symmetrical to each other. The first and second contact holes H21 and H22 expose the drain and source regions of the active layer 115, respectively.

Figure 6A:
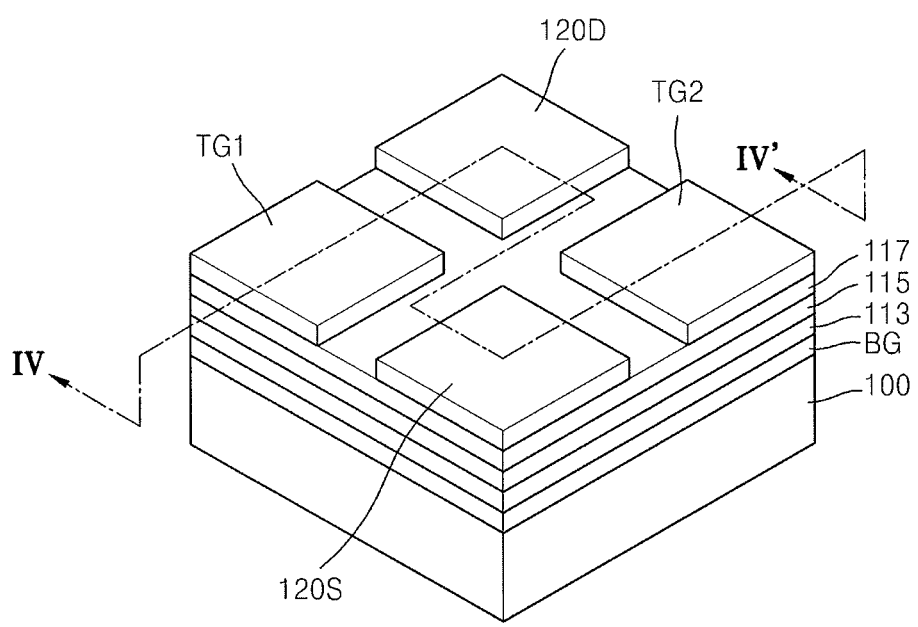
Figure 6B:
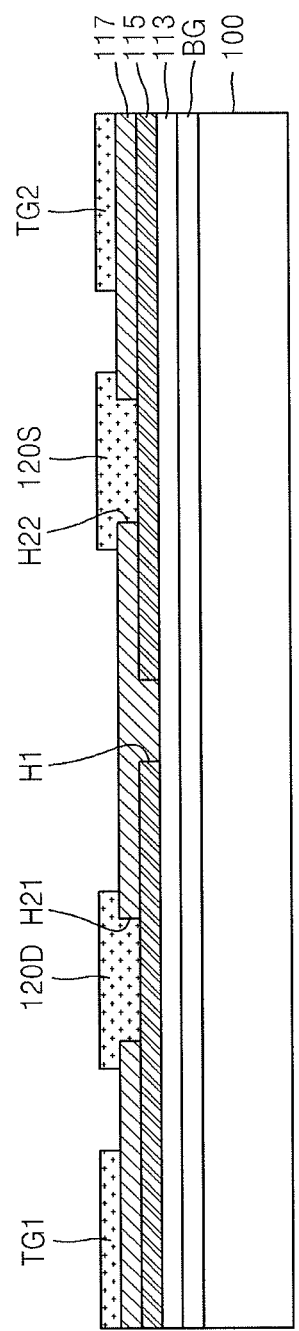

Referring to FIGS. 6A and 6B, the drain electrode 120D, the source electrode 120S, and the first and second top gate electrodes TG1 and TG2 are formed on the substrate 100 on which the etch stop layer 117 has been formed.

The drain electrode 120D, the source electrode 120S, and the first and second top gate electrodes TG1 and TG2 may be formed by forming a metal layer on the etch stop layer 117 and patterning the metal layer into four electrodes. The metal layer is formed of a conductive material. The conductive material may be a metal such as Cr, Pt, Ru, Au, Ag, Mo, Al, W, Cu, or AlNd, or a conductive oxide such as ITO, GIZO, GZO, AZO, IZO (i.e., InZnO), or AZO (i.e., AlZnO). The metal layer may be the same as the metal layer used to form the bottom gate electrode BG.

The drain electrode 120D is formed on one corner area of the square active layer 115 by burying the first contact hole H21, and the source electrode 120S is formed on the corner area diagonally facing the drain electrode 120D by burying the second contact hole H22. Alternatively, the source electrode 120S may be formed on the first contact hole H21, and the drain electrode 120D may be formed on the second contact hole H22. The drain electrode 120D and the source electrode 120S may contact the drain region and the source region of the active layer 115 via the first and second contact holes H21 and H22, respectively.

The first and second top gate electrodes TG1 and TG2 are formed on the two remaining corner areas, respectively, in which the first and second contact holes H21 and H22 are not formed, so as to be symmetrical to each other.

A passivation layer (not shown) may be formed on the first and second top gate electrodes TG1 and TG2, the drain electrode 120D, and the source electrode 120S. The passivation layer may be formed of an insulative material such as $SiO_x$ or $SiN_x$. An insulative material or the like may be further included to form the passivation layer.

Figure 7:
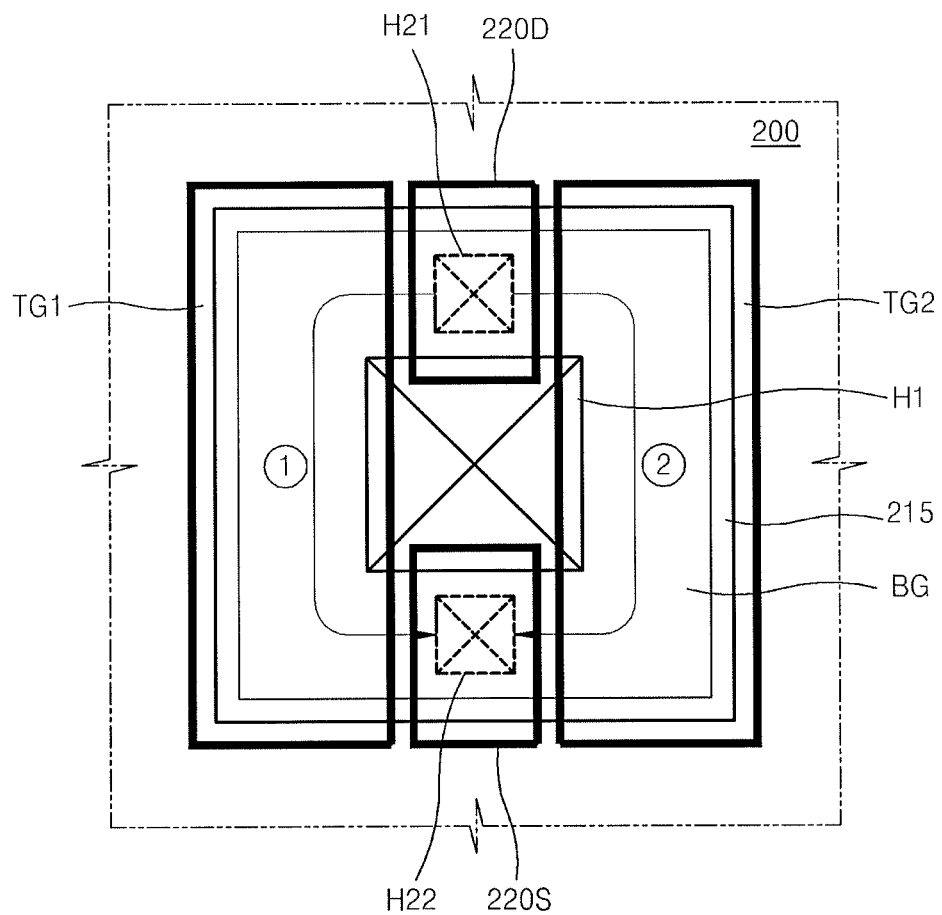
FIG. 7 illustrates a plan view of a TFT sensor according to another embodiment of the present invention.

FIG. 7 is a plan view of a TFT sensor according to another embodiment of the present invention.

Referring to FIG. 7, the TFT sensor includes an integrated-type bottom gate electrode and a separated-type top gate electrode. The TFT sensor includes a bottom gate electrode BG. The TFT sensor includes, on the bottom gate electrode BG, a TFT including a first top gate electrode TG1, a second top gate electrode TG2, a drain electrode 220D, and a source electrode 220S on the same plane.

The bottom gate electrode BG is square and formed on a substrate 200. An active layer 215 has a square donut shape, has a separation hole H1 for channel separation, and is formed on the bottom gate electrode BG. The separation hole H1 is located at the center of the active layer 215, and the active layer 215 is formed of oxide semiconductor.

The size of the separation hole H1 may depend on a static resolving power and a direction sensing performance of the TFT sensor. When the separation hole H1 is bigger, the static resolving power decreases, whereas the direction sensing performance improves. Otherwise, the static resolving power increases, whereas the direction sensing performance degrades.

A drain region and a source region of the active layer 215 contact the drain electrode 220D and the source electrode 220S via first and second contact holes H21 and H22, respectively. The drain electrode 220D and the source electrode 220S are formed at the center of two facing edges (long edges or short edges) of the four edges of the square active layer 215. The first top gate electrode TG1 and the second top gate electrode TG2 are formed on the remaining edges facing each other on the same level as the drain electrode 220D and the source electrode 220S.

Because of the separation hole H1, a current Ids flowing from the drain electrode 220D to the source electrode 220S may flow through a first channel ① passing through the first top gate electrode TG1 and a second channel ② passing through the second top gate electrode TG2.

A method of driving the TFT sensor of FIG. 7 is the same as that described above with reference to FIGS. 2A and 2B, and thus a detailed description thereof will be omitted.

FIGS. 8A through 11B are perspective views and cross-sectional views for explaining a method of manufacturing the TFT sensor illustrated in FIG. 7.

Figure 8A:
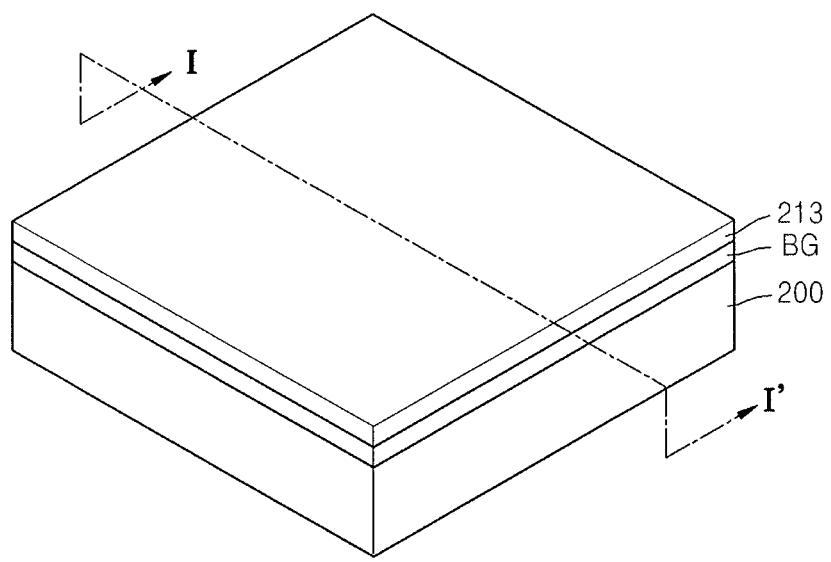
FIGS. 8A through 11B illustrates perspective views and cross-sectional views for explaining a method of manufacturing the TFT sensor illustrated in FIG. 7.
Figure 8B:
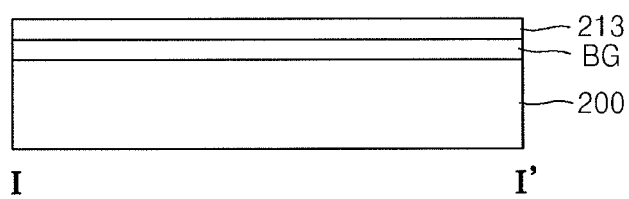

Referring to FIGS. 8A and 8B, the bottom gate electrode BG is formed on the substrate 200.

The substrate 200 may be formed of a transparent glass material mainly including $SiO_2$. The substrate 200 may also be formed of a plastic material. The substrate 200 may include a metal foil and a flexible substrate.

Before the bottom gate electrode BG is formed, a buffer layer (not shown) may be formed on the substrate 200. The buffer layer may block impurities of the substrate 200 from penetrating into layers stacked on the substrate 200. The buffer layer may include $SiO_2$ and/or $SiN_x$.

The bottom gate electrode BG is formed by forming a metal layer on the substrate 200 and patterning the metal layer to have a square shape. Although the metal layer of the bottom gate electrode BG may be formed of a metal or a metal alloy such as Au, Ag, Cu, Ni, Pt, Pd, Al, Mo, W, Ti, an Al:Nd alloy, or a Mo:W alloy, the present invention is not limited thereto, and other various materials may be used in consideration of adhesion of the bottom gate electrode BG with a neighboring layer, the flatness of the stacked layers, electric resistance, processability, and the like.

A gate insulation layer 213 is formed on the substrate 200 on which the bottom gate electrode BG has been formed. The gate insulation layer 213 may be formed of an insulative material such as $SiO_x$ or $SiN_x$. For example, the gate insulation layer 113 may be a TEOS oxide layer. The gate insulation layer 213 may also be formed of an insulative organic material or the like.

Figure 9A:
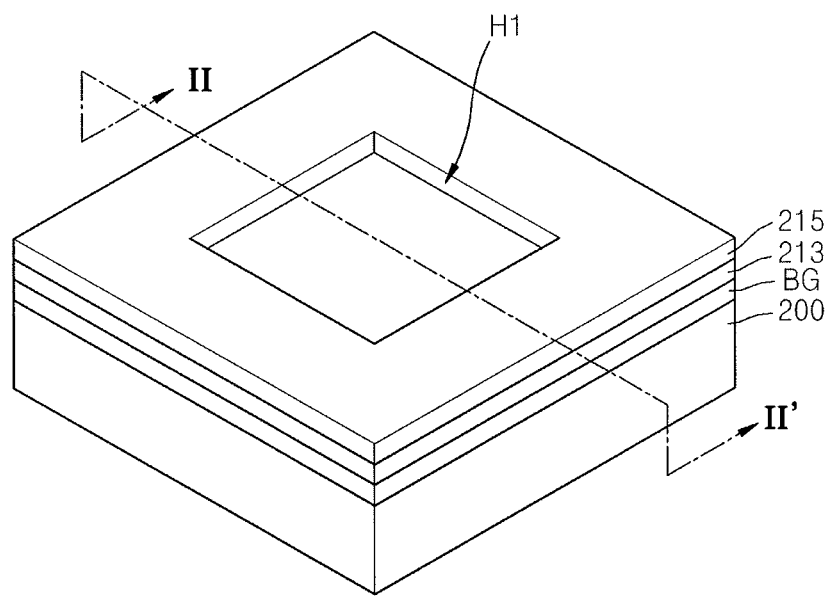
Figure 9B:
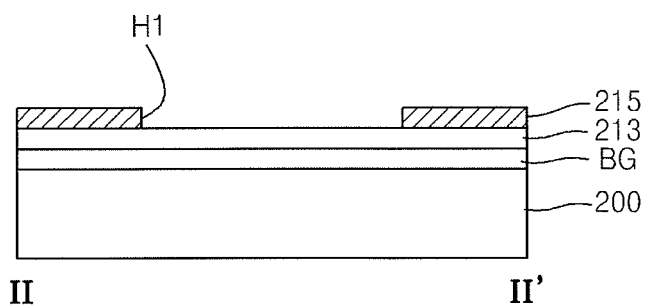

Referring to FIGS. 9A and 9B, the active layer 215 is formed on the substrate 200 on which the gate insulation layer 213 has been formed.

The active layer 215 may include oxide semiconductor including at least one element selected from the group consisting of In, Ga, Zn, Sn, Sb, Ge, Hf, Al, and As. For example, the oxide semiconductor may include at least one selected from the group consisting of ZnO, $SnO_2$, $In_2O_3$, $Zn_2SnO_4$, $Ga_2O_3$, and $HfO_2$. The active layer 215 may be formed of transparent oxide semiconductor. Examples of the transparent oxide semiconductor may include Zinc Oxide, Tin Oxide, Ga—In—Zn Oxide, In—Zn Oxide, In—Sn Oxide, or the like, but the present invention is not limited thereto.

The active layer 215 may be formed by sputtering, which is a physical deposition method. The active layer 215 may be formed by controlling the flux of oxygen according to a resistance required by the TFT sensor. The active layer 215 may be formed by forming an oxide semiconductor layer on the gate insulation layer 213 and patterning the oxide semiconductor layer to have a square shape corresponding to the bottom gate electrode BG.

The separation hole H1 is formed at the center of the active layer 215 so as to expose a portion the gate insulation layer 213 formed below the active layer 215. The active layer 215 has a square donut shape because of the separation hole H1. The separation hole H1 may penetrate from the gate insulation layer 213 to the bottom gate electrode BG.

Figure 10A:
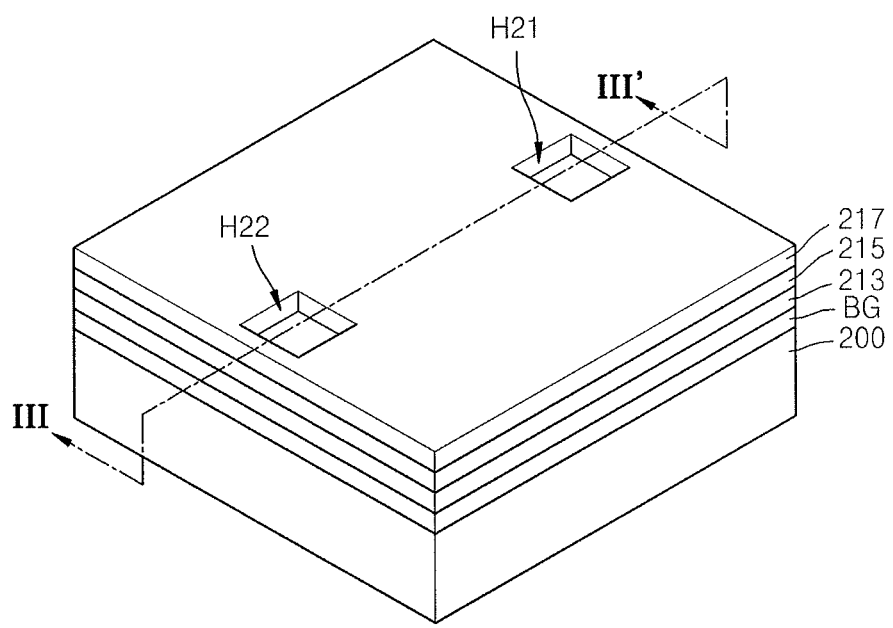
Figure 10B:
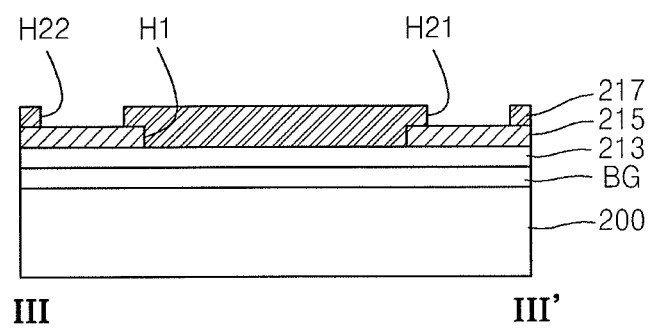

Referring to FIGS. 10A and 10B, an etch stop layer 217 is formed on the substrate 200 on which the active layer 215 has been formed.

The etch stop layer 217 may be formed of an insulative material such as $SiO_x$ or $SiN_x$, but the present invention is not limited thereto. The etch stop layer 217 may be formed by low-temperature CVD.

The etch stop layer 217 buries the separation hole H1 of the active layer 215. The etch stop layer 217 includes the first and second contact holes H21 and H22 formed at the centers of two of the four edges of the square active layer 215 so as to be symmetrical to each other. The first and second contact holes H21 and H22 expose portions of the drain and source regions of the active layer 215.

Figure 11A:
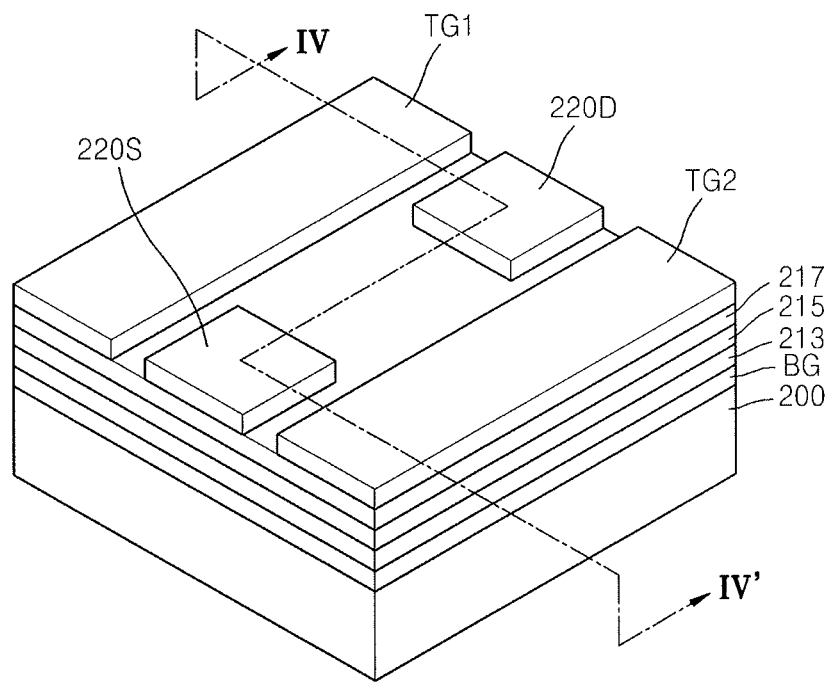
Figure 11B:
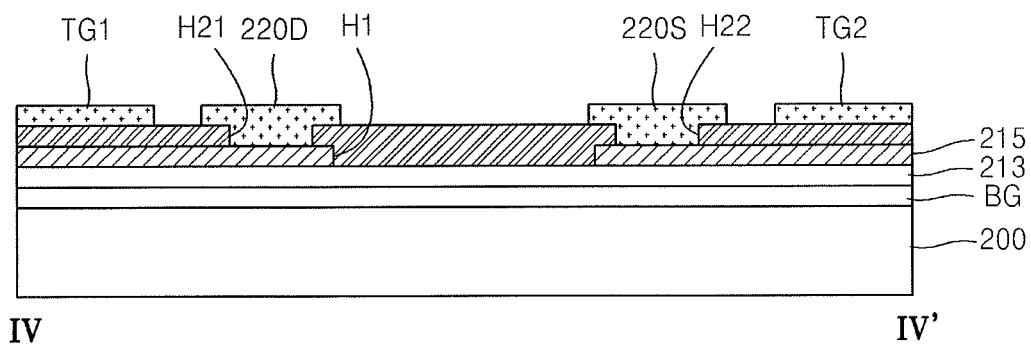

Referring to FIGS. 11A and 11B, the drain electrode 220D, the source electrode 220S, and the first and second top gate electrodes TG1 and TG2 are formed on the substrate 200 on which the etch stop layer 217 has been formed.

The drain electrode 220D, the source electrode 220S, and the first and second top gate electrodes TG1 and TG2 may be formed by forming a metal layer on the etch stop layer 217 and patterning the metal layer into four electrodes. The metal layer is formed of a conductive material. The conductive material may be a metal such as Cr, Pt, Ru, Au, Ag, Mo, Al, W, Cu, or AlNd, or a conductive oxide such as ITO, GIZO, GZO, AZO, IZO (i.e., InZnO), or AZO (i.e., AlZnO). The metal layer may be the same as the metal layer used to form the bottom gate electrode BG.

The drain electrode 220D buries the first contact hole H21 and is formed at the center of one edge of the square active layer 215. The source electrode 220S buries the second contact hole H22, is formed at the center of one edge of the square active layer 215, and symmetrically faces the drain electrode 220D. Alternatively, the source electrode 220S may be formed on the first contact hole H21, and the drain electrode 220D may be formed on the second contact hole H22. The drain electrode 220D and the source electrode 220S may contact the drain region and the source region of the active layer 215 via the first and second contact holes H21 and H22, respectively.

The first and second top gate electrodes TG1 and TG2 are formed on the remaining edges, respectively, in which the first and second contact holes H21 and H22 are not formed, so as to symmetrically face each other.

A passivation layer (not shown) may be formed on the first and second top gate electrodes TG1 and TG2, the drain electrode 220D, and the source electrode 220S. The passivation layer may be formed of an insulative material such as SiOx or SiNx, and an insulative material or the like may be further included to form the passivation layer.

Figure 12A:
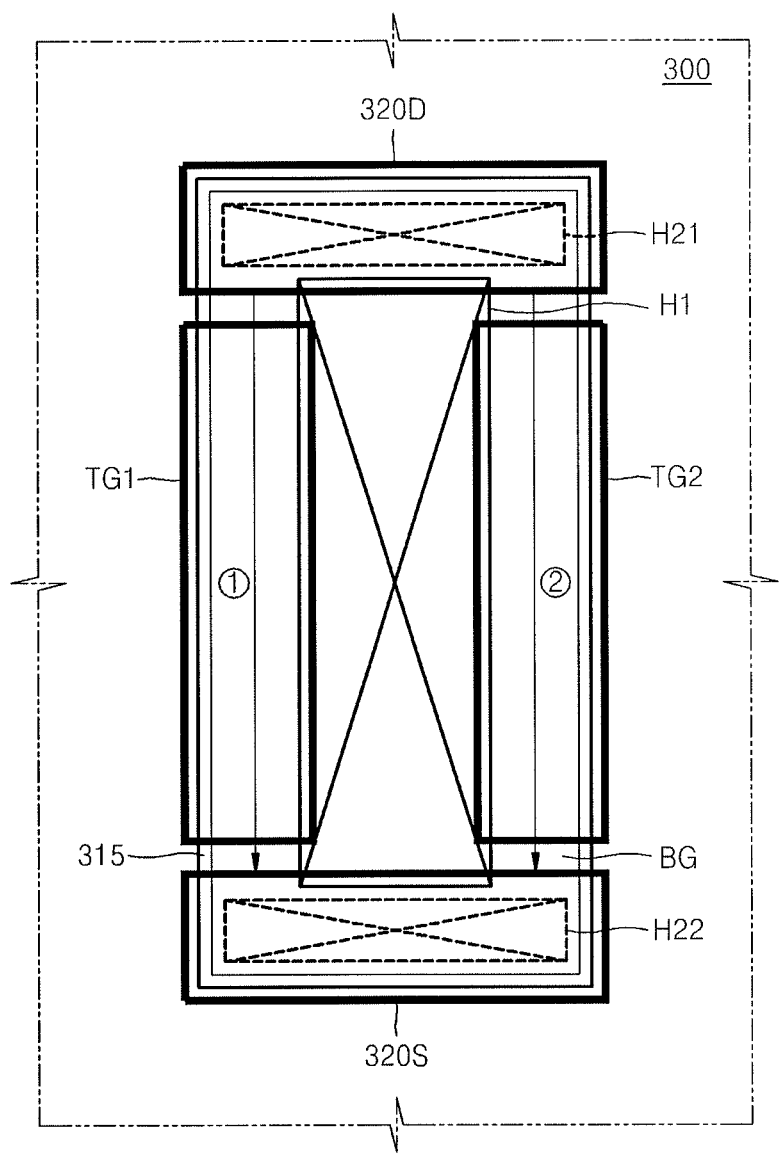
FIGS. 12A through 12C illustrate a TFT sensor according to another embodiment of the present invention.
Figure 12B:
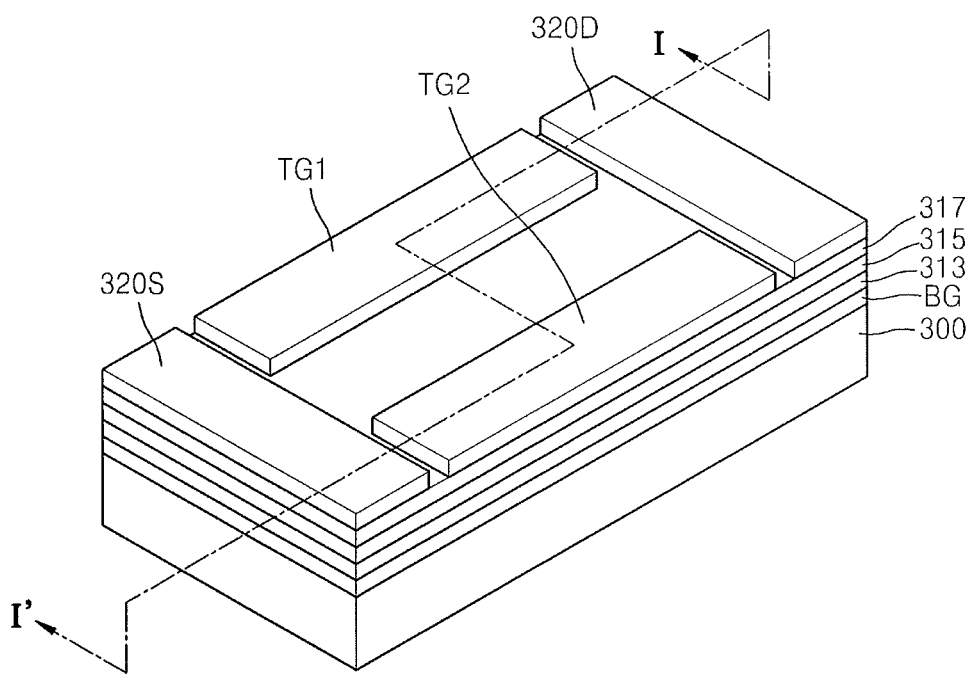
Figure 12C:
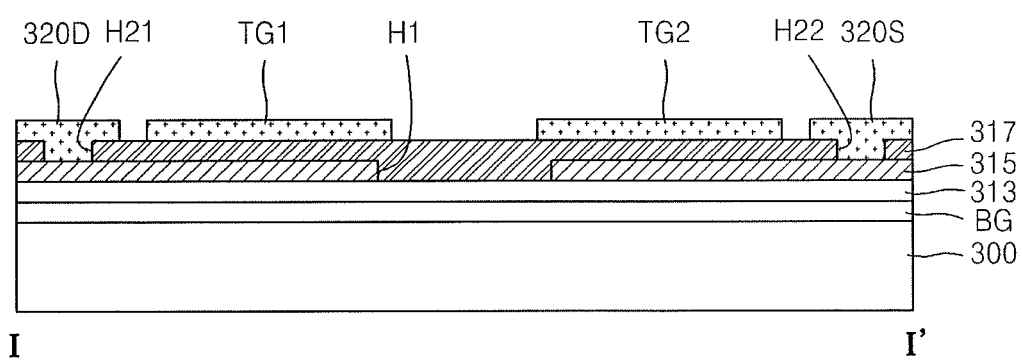

FIGS. 12A through 12C illustrate a TFT sensor according to another embodiment of the present invention.

Referring to FIGS. 12A through 12C, the TFT sensor includes a TFT including first and second top gate electrodes TG1 and TG2, a drain electrode 320D, and a source electrode 320S on the same plane on a bottom gate electrode BG. The TFT sensor according to the present embodiment is rectangular and accordingly is different from the TFT sensor of FIG. 1, which is square. A detailed description of the same contents as those of the TFT sensor of FIG. 1 will be omitted.

The bottom gate electrode BG is rectangular and formed on a substrate 300. Before the bottom gate electrode BG is formed, a buffer layer (not shown) may be formed on the substrate 300. A gate insulation layer 313 is formed on the bottom gate electrode BG. An active layer 315 has a separation hole H1 for channel separation, and is formed on the gate insulation layer 313. The active layer 315 is formed of oxide semiconductor, and has a rectangular donut shape because of the separation hole H1 extending along a long edge of the active layer 315 at the center of the active layer 315. A drain region and a source region of the active layer 315 are exposed through first and second contact holes H21 and H22 formed in an etch stop layer 317 on the active layer 315. The first and second contact holes H21 and H22 extend along short edges of the rectangular active layer 315 so as to symmetrically face each other. The drain electrode 320D and the source electrode 320S are formed on the etch stop layer 317 and bury the first contact hole H21 and the second contact hole H22, respectively. The drain electrode 320D and the source electrode 320S contact the drain region and the source region, respectively, of the active layer 315. The drain electrode 320D and the source electrode 320S are formed along the short edges of the rectangular active layer 315 so as to symmetrically face each other. The first and second top gate electrodes TG 1 and TG2 are formed along the long edges of the rectangular active layer 315 on the same level as the drain electrode 320D and the source electrode 320S so as to symmetrically face each other. The first and second top gate electrodes TG1 and TG2 neither overlap with nor contact the drain electrode 320D and the source electrode 320S.

Because of the separation hole H1, a current Ids flowing from the drain electrode 320D to the source electrode 320S may flow through a first channel ① passing through the first top gate electrode TG1 and a second channel ② passing through the second top gate electrode TG2. A method of driving the TFT sensor of FIG. 12A is the same as that described above with reference to FIGS. 2A and 2B, and thus a detailed description thereof will be omitted.

Figure 13A:
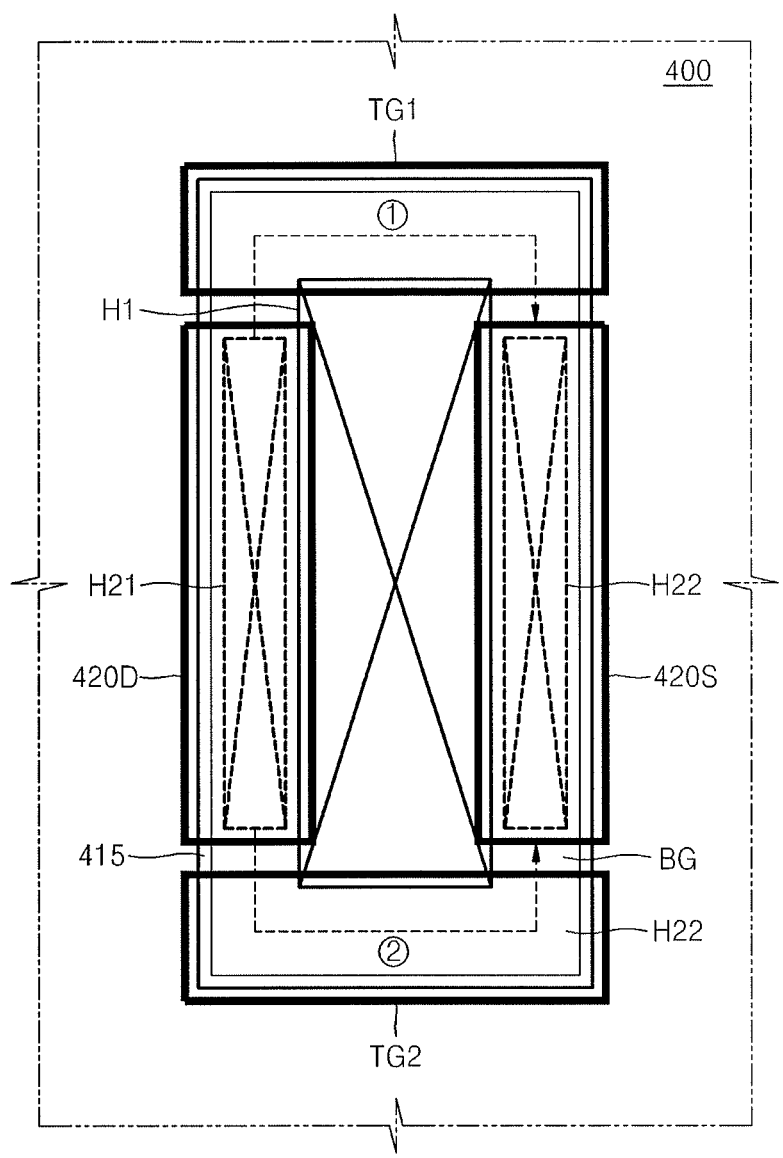
FIGS. 13A through 13C illustrate a TFT sensor according to another embodiment of the present invention.
Figure 13B:
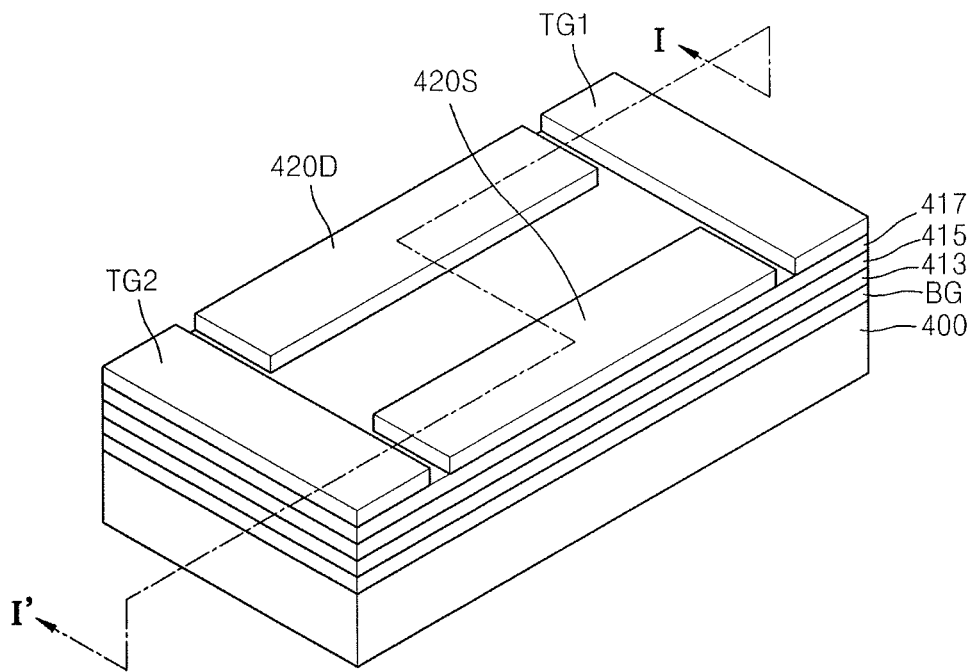
Figure 13C:
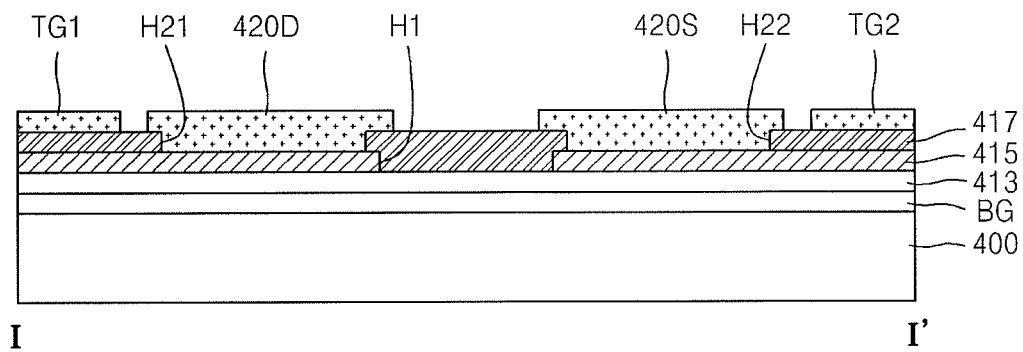

FIGS. 13A through 13C illustrate a TFT sensor according to another embodiment of the present invention.

Referring to FIGS. 13A through 13C, the TFT sensor includes a TFT including first and second top gate electrodes TG1 and TG2, a drain electrode 420D, and a source electrode 420S on the same plane on a bottom gate electrode BG. The TFT sensor according to the present embodiment is rectangular and accordingly is different from the TFT sensor of FIG. 1, which is square. A detailed description of the same contents as those of the TFT sensor of FIG. 1 will be omitted.

Before the bottom gate electrode BG is formed, a buffer layer (not shown) may be formed on a substrate 400. A gate insulation layer 413 is formed on the bottom gate electrode BG. An active layer 415 has a separation hole H1 for channel separation, and is formed on the gate insulation layer 413. The active layer 415 is formed of oxide semiconductor, and has a rectangular donut shape because of the separation hole H1 extending along long edges of the rectangular active layer 415 at the center of the active layer 415. A drain region and a source region of the active layer 415 are exposed through first and second contact holes H21 and H22 formed in an etch stop layer 417 on the active layer 415. The first and second contact holes H21 and H22 are formed along the long edges of the rectangular active layer 415 so as to symmetrically face each other. The drain electrode 420D and the source electrode 420S are formed on the etch stop layer 417 and bury the first contact hole H21 and the second contact hole H22, respectively. The drain electrode 420D and the source electrode 420S contact the drain region and the source region, respectively, of the active layer 415. The drain electrode 420D and the source electrode 420S are formed along the long edges of the rectangular active layer 415 so as to symmetrically face each other. The first and second top gate electrodes TG1 and TG2 are formed along short edges of the rectangular active layer 415 on the same level as the drain electrode 420D and the source electrode 420S so as to symmetrically face each other. The first and second top gate electrodes TG1 and TG2 neither overlap with nor contact the drain electrode 420D and the source electrode 420S.

Because of the separation hole H1, a current Ids flowing from the drain electrode 420D to the source electrode 420S may flow through a first channel ① passing through the first top gate electrode TG1 and a second channel ② passing through the second top gate electrode TG2. A method of driving the TFT sensor of FIG. 13A is the same as that described above with reference to FIGS. 2A and 2B, and thus a detailed description thereof will be omitted.

Figure 14:
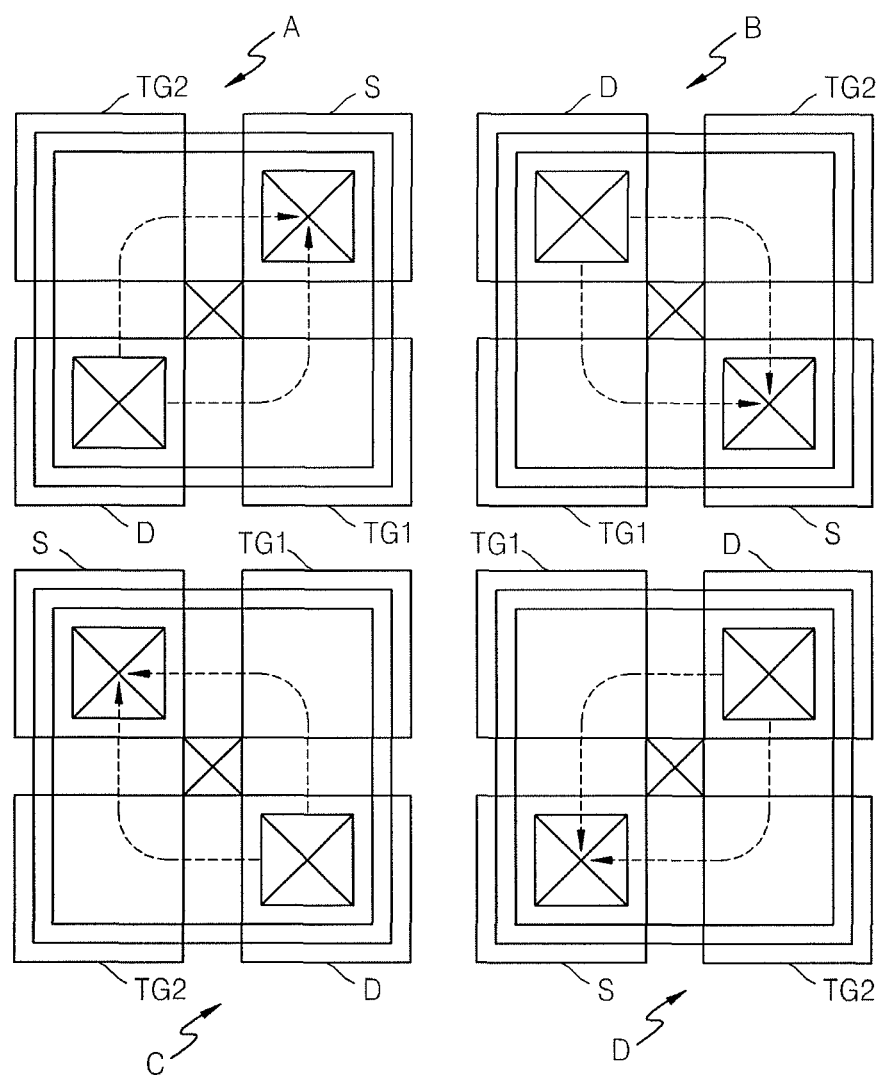
FIG. 14 illustrates a TFT sensor array according to an embodiment of the present invention.

FIG. 14 illustrates a TFT sensor array according to an embodiment of the present invention.

Referring to FIG. 14, the TFT sensor array is formed by arranging a plurality of TFT sensors by changing the direction of a TFT clockwise or counterclockwise at intervals of 90 degrees. For example, the embodiment of FIG. 14 is a sensor in which an array (including a first TFT A, a second TFT B obtained by rotating the first TFT A by 90 degrees clockwise, a third TFT C obtained by rotating the second TFT B by 90 degrees clockwise, and a fourth TFT D obtained by rotating the third TFT C by 90 degrees clockwise) constitutes a single sensing cell. Each TFT includes a first top gate electrode TG1, a second top gate electrode TG2, a drain electrode D, and a source electrode S on the same plane. This array structure may be used to form a sensor having a high direction sensitivity with respect to left, right, up, and down directions.

Figure 15:
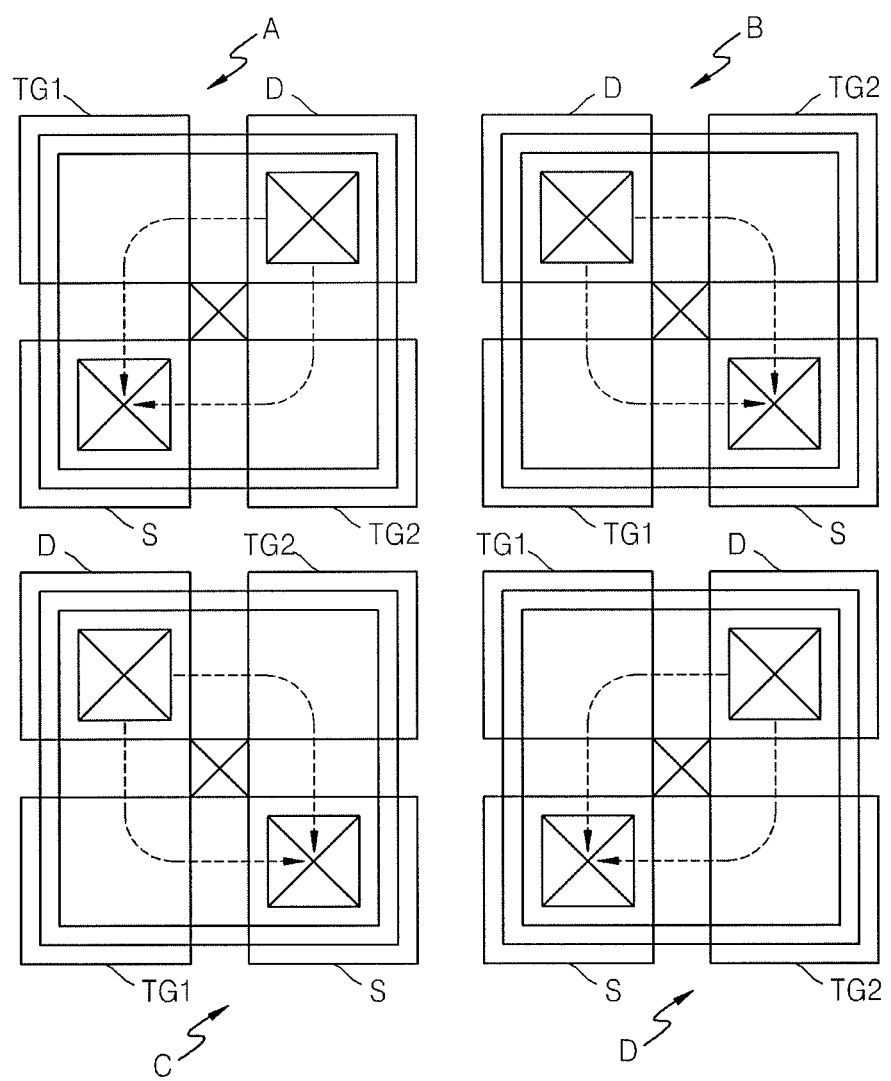
FIG. 15 illustrates a TFT sensor array according to another embodiment of the present invention.

FIG. 15 illustrates a TFT sensor array according to another embodiment of the present invention.

Referring to FIG. 15, the TFT sensor array is formed by arranging a plurality of TFTs by changing the direction of a TFT by 90 degrees. The embodiment of FIG. 15 is a sensor in which an array (including a first TFT A, a second TFT B obtained by rotating the first TFT A by 90 degrees counterclockwise, a third TFT C having the same structure as the second TFT B, and a fourth TFT D obtained by rotating the third TFT C by 90 degrees clockwise) constitutes a single sensing cell. TFTs existing on a diagonal line have the same structure. Each TFT includes a first top gate electrode TG1, a second top gate electrode TG2, a drain electrode D, and a source electrode S on the same plane. Such an array structure can overlap the intensities of currents in the same direction with each other, and thus a sensor sensitive to the current can be formed.

Although a TFT sensor array using the TFT sensor of FIG. 1 is illustrated in the embodiments of FIGS. 14 and 15, the TFT sensors of FIGS. 7, 12A, and 13A may be used to form the TFT sensor array.

Figure 16:
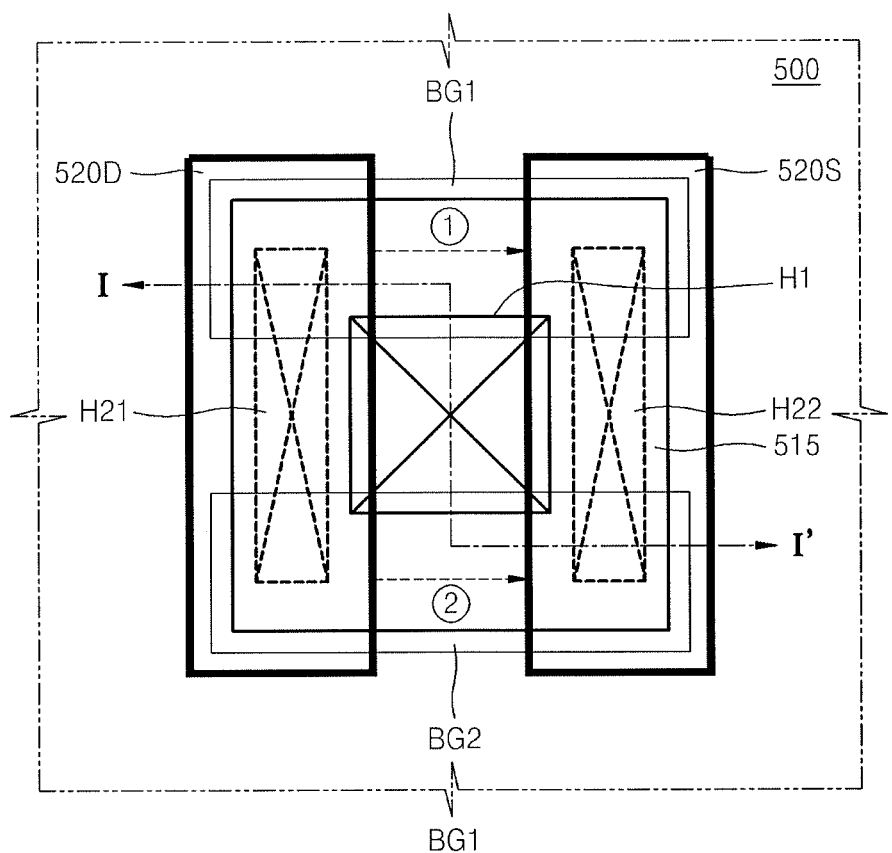
FIGS. 16 and 17 illustrate a plan view and a cross-sectional view of a TFT sensor according to another embodiment of the present invention.
Figure 17:
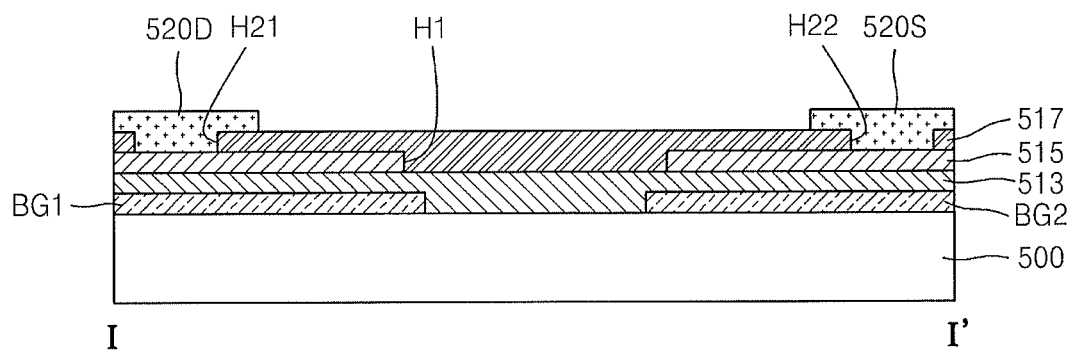

FIGS. 16 and 17 illustrate a TFT sensor according to another embodiment of the present invention.

Referring to FIGS. 16 and 17, the TFT sensor includes a separated-type bottom gate electrode. Referring to FIGS. 16 and 17, the TFT sensor includes a first bottom gate electrode BG1 and a second bottom gate electrode BG2. The TFT sensor also includes a drain electrode 520D and a source electrode 520S formed on the first and second bottom gate electrodes BG1 and BG2 so as to be perpendicular to the first and second bottom gate electrodes BG1 and BG2.

The first and second bottom gate electrodes BG1 and BG2 are formed a predetermined distance apart from each other on a substrate 500. The substrate 500 may be formed of a transparent glass material mainly including $SiO_2$. The substrate 500 may also be formed of a plastic material. The substrate 500 may include a metal foil, a flexible substrate, etc.

Before the first and second bottom gate electrodes BG1 and BG2 are formed, a buffer layer (not shown) may be formed on the substrate 500. The buffer layer may block impurities of the substrate 500 from penetrating into layers stacked on the substrate 500. The buffer layer may include $SiO_2$ and/or $SiN_x$.

Although the first and second bottom gate electrodes BG1 and BG2 may be formed of a metal or a metal alloy such as Au, Ag, Cu, Ni, Pt, Pd, Al, Mo, W, Ti, an Al:Nd alloy, or a Mo:W alloy, the present invention is not limited thereto, and other various materials may be used in consideration of adhesions of the first and second bottom gate electrodes BG1 and BG2 with a neighbor layer, the flatness of the stacked layers, electric resistance, processability, and the like.

A gate insulation layer 513 is formed on the first and second bottom gate electrodes BG1 and BG2. The gate insulation layer 513 may be formed of an insulative material such as $SiO_x$ or $SiN_x$. For example, the gate insulation layer 513 may be a TEOS oxide layer. The gate insulation layer 513 may also be formed of an insulative organic material or the like.

An active layer 515 has a separation hole H1 for channel separation, and is formed on the gate insulation layer 513. The active layer 515 is formed of oxide semiconductor, and has a square or rectangular donut shape because of the separation hole H1 formed at the center of the active layer 515.

The active layer 515 may include oxide semiconductor including at least one element selected from the group consisting of group III elements and group IV elements such as In, Ga, Zn, Sn, Sb, Ge, Hf, Al, and As. For example, the oxide semiconductor may include at least one selected from the group consisting of ZnO, $SnO_2$, $In_2O_3$, $Zn_2SnO_4$, $Ga_2O_3$, and $HfO_2$. The active layer 515 may be formed of transparent oxide semiconductor. Examples of the transparent oxide semiconductor may include Zinc Oxide, Tin Oxide, Ga—In—Zn Oxide, In—Zn Oxide, In—Sn Oxide, and the like, and the present invention is not limited thereto.

An etch stop layer 517 is formed on the active layer 515. The etch stop layer 517 includes a first contact hole H21 and a second contact hole H22 formed along two edges of the square or rectangular active layer 515 so as to be symmetrical to each other. The first and second contact holes H21 and H22 are formed perpendicularly to the first and second bottom gate electrodes BG1 and BG2.

The etch stop layer 517 may be formed of an insulative material such as $SiO_x$ or $SiN_x$, but the present invention is not limited thereto. The etch stop layer 517 may be formed by low-temperature CVD.

The drain electrode 520D and the source electrode 520S are formed on the etch stop layer 517. The drain electrode 520D and the source electrode 520S may contact the drain and source regions of the active layer 515 via the first and second contact holes H21 and H22, respectively. Portions of the drain electrode 520D and the source electrode 520S are overlapped by respective facing ends of the first and second bottom gate electrodes BG1 and BG2 and by the other respective facing ends thereof, respectively.

The first and second bottom gate electrodes BG1 and BG2 of the TFT transistor including the separated-type bottom gate electrode, that is, a bottom gate separation type TFT, serve as the first and second top gate electrodes TG1 and TG2 of the TFT including an integrated bottom gate electrode and a separated top gate electrode.

Although a square TFT sensor is illustrated in FIGS. 16 and 17, a TFT sensor using a rectangular active layer may also have the same structure as that of the square TFT sensor.

Figure 18A:
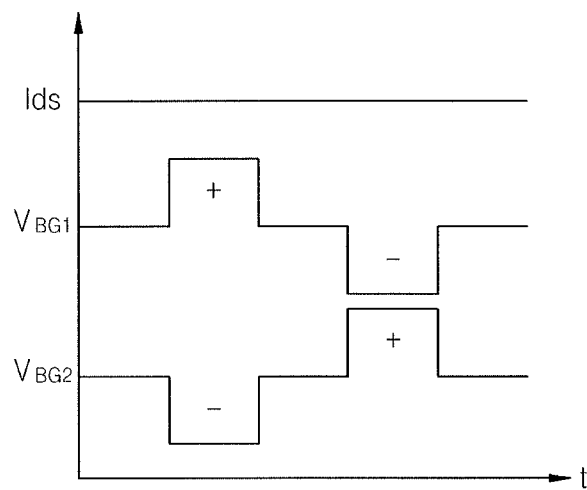
FIGS. 18A and 18B illustrate graphs for explaining a method of driving the TFT sensor illustrated in FIG. 16.
Figure 18B:
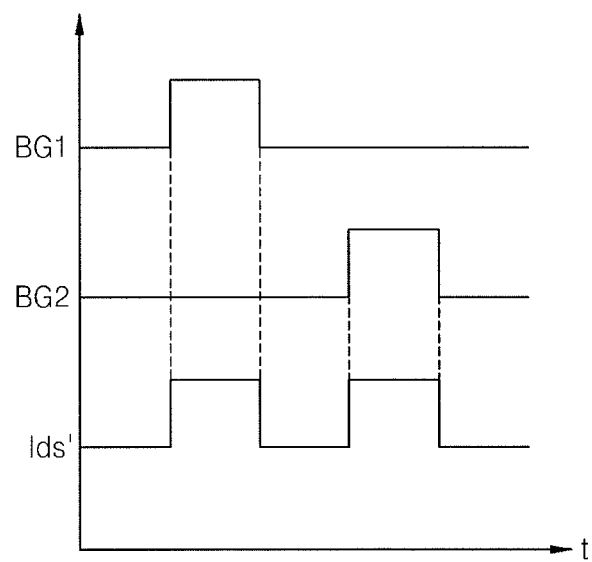

FIGS. 18A and 18B are graphs for explaining a method of driving the TFT sensor illustrated in FIG. 16.

Referring to FIG. 18A, voltages having different polarities are periodically applied to the first and second bottom gate electrodes BG1 and BG2 of the TFT sensor. At this time, the amount of a sum of the current flowing to the first channel ① and a current flowing to the second channel ②, namely, a total current Ids, is constant regardless of time. The current flowing in a channel may be controlled using the polarities of the voltages applied to the first and second bottom gate electrodes BG1 and BG2. Thus, the directions of currents flowing to two channels may be controlled.

For example, when a positive voltage is applied to the first bottom gate electrode BG1 and a negative voltage is applied to the second bottom gate electrode BG2, most current flows through the first channel ①. When a negative voltage is applied to the first bottom gate electrode BG1 and a positive voltage is applied to the second bottom gate electrode BG2, most current flows through the second channel ②. In other words, the amount of the total current Ids is constant, and the direction of the current may be controlled by changing the amounts of currents flowing through the two channels.

Referring to FIG. 18B, when there is surface charge due to contact or non-contact of an external charged body with an upper surface of a TFT, the amount of current flowing through the channel of the active layer 515 varies. For example, when contact or non-contact of the external charged body occurs near the first bottom gate electrode BG1, the current flowing through the first channel ① increases instantly (Ids'). When contact or non-contact of the external charged body occurs near the second bottom gate electrode BG2, the current flowing through the second channel ② increases instantly (Ids'). Accordingly, it is known that the charged body has moved from the vicinity of the first bottom gate electrode BG1 to the vicinity of the second bottom gate electrode BG2. In other words, the moving direction (or touch direction) of the external charged body may be determined from a difference between the amounts of currents flowing through the first and second channels, and a charge intensity (or touch intensity) of the external charged body may be determined from the amounts of the currents.

Figure 19:
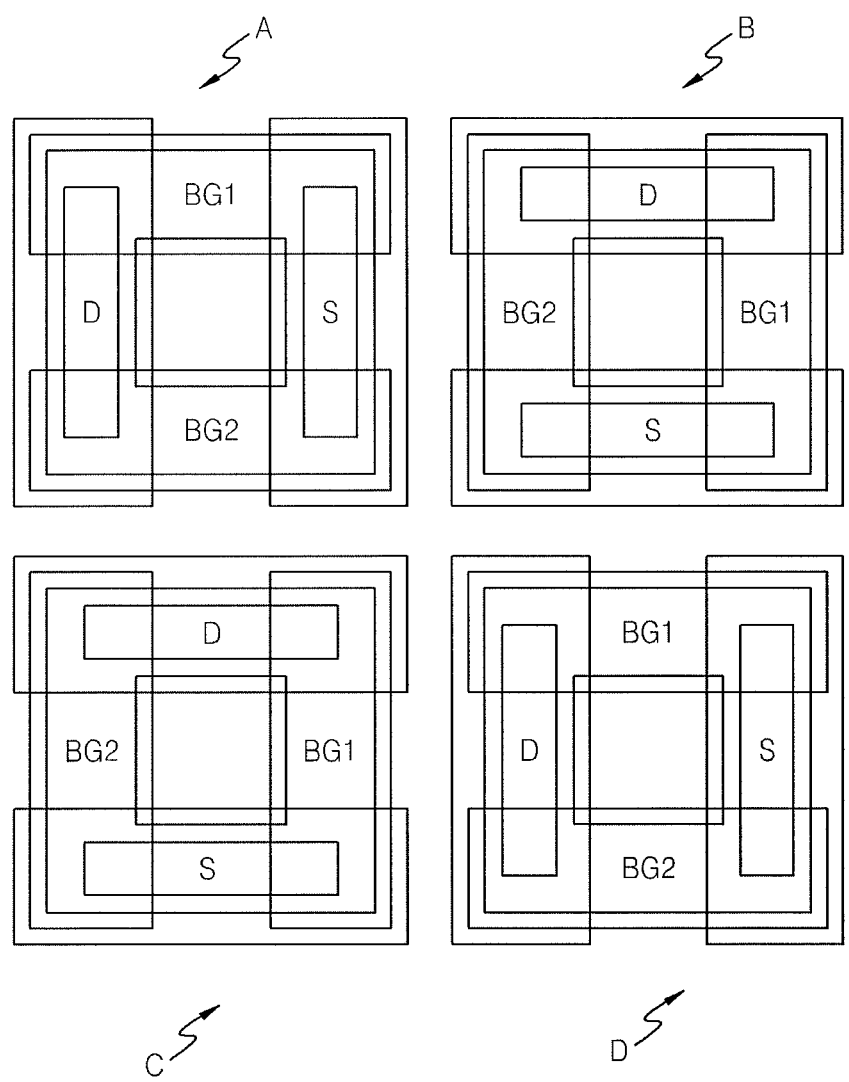
FIG. 19 illustrates a TFT sensor array formed with the TFT sensor illustrated in FIG. 16.

FIG. 19 illustrates a TFT sensor array formed with the TFT sensor illustrated in FIG. 16.

Referring to FIG. 19, the TFT array is formed by arranging a plurality of TFT sensors by changing the direction of a TFT only by 90 degrees. The embodiment of FIG. 19 is a sensor in which an array (including a first TFT A, a second TFT B obtained by rotating the first TFT A by 90 degrees counter-clockwise, a third TFT C having the same structure as the second TFT B, and a fourth TFT D obtained by rotating the third TFT C by 90 degrees clockwise) constitutes each sensing cell. TFTs existing on a diagonal line have the same structure.

Although the above-described embodiments describe NMOS transistors for convenience of explanation, the present invention may also be applied to PMOS transistors including a p-type active layer. The p-type active layer may be a Cu oxide layer ($CuBO_2$ layer, $CuAlO_2$ layer, $CuGaO_2$ layer, $CuInO_2$ layer, or the like), a Ni oxide layer, a Ti-doped Ni oxide layer, a ZnO-based oxide layer doped with at least one of a group I element, a group II element, and a group V element, a ZnO-based oxide layer doped with Ag, a PbS layer, a LaCuOS layer, or a LaCuOSe layer.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin-film transistor (TFT) sensor, comprising:
    a bottom gate electrode on a substrate;
    an insulation layer on the bottom gate electrode;
    an active layer in a donut shape on the insulation layer, the active layer including a first channel and a second channel through which current generated by a charged body flows and including a hole for separation of the first channel and the second channel;
    an etch stop layer on the active layer, the etch stop layer including a first contact hole and a second contact hole, and including a middle portion that overlaps the hole for separation of the first channel and the second channel;
    a source electrode and a drain electrode burying the first contact hole and the second contact holes, the source electrode and the drain electrodes being symmetrically disposed on a pair of first opposite regions of the middle portion of the etch stop layer so as to face each other;
    a first top gate electrode and a second top gate electrode that are symmetrically disposed on a pair of second opposite regions of the middle portion of the etch stop layer so as to face each other, the first top gate electrode and the second top gate electrode being spaced apart from each other and controlling flow of the current through the first channel and the second channels, respectively, wherein each of the first opposite regions does not overlap with each of the second opposite regions; and wherein changes in amounts of the currents flowing in the first channel and the second channels occur based on movement of the charged body relative to the first top gate electrode and the second top gate electrodes, and correspond to a touch direction and a touch intensity of the charged body.

2. The TFT sensor as claimed in claim 1, wherein:
the donut shape is generally a square or rectangle, and
the first contact hole and the second contact holes are disposed on corner areas of the active layer so as to diagonally face each other.

3. The TFT sensor as claimed in claim 1, wherein the first contact hole and the second contact holes are formed on edges of the active layer so as to face each other.

4. The TFT sensor as claimed in claim 1, wherein the first top gate electrode and the second top gate electrodes are on a same level as the source electrode and the drain electrodes without physically contacting the source electrode and the drain electrode.

5. The TFT sensor as claimed in claim 4, wherein a direction of the current flowing in the first channel and the second channel is controlled by applying a periodically-swinging voltage to the first top gate electrode and the second top gate electrode.

6. The TFT sensor as claimed in claim 1, wherein the hole is at the center of the active layer, and the first channel and the second channels are arranged on different sides of the hole.

7. The TFT sensor as claimed in claim 1, wherein the active layer includes an oxide semiconductor.

8. The TFT sensor as claimed in claim 1, wherein:
the active layer has four outer edges,
the first contact hole and the second contact holes are symmetrically disposed on two of the four outer edges, facing each other, and
the source electrode and the drain electrode are symmetrically disposed on the two of the four outer edges, and the first top gate electrode and the second top gate electrode are symmetrically disposed on two remaining edges of the four outer edges without physically contacting the source electrode and the drain electrode.

9. The TFT sensor as claimed in claim 1, wherein the donut shape is generally a square or rectangle.

10. The TFT sensor as claimed in claim 1, wherein the touch direction is determined from a difference between the amounts of the currents flowing through the first channel and the second channels by the first top gate electrode and the second top gate electrodes over time, and the touch intensity is determined from the amounts of the currents flowing through the first channel and the second channels by the first and second top gate electrodes.

11. The TFT sensor as claimed in claim 1, wherein the bottom gate electrode, the first top gate electrode, and the second top gate electrode are disconnected from one another.

12. A thin-film transistor (TFT) sensor, comprising:
a bottom gate electrode on a substrate;
an insulation layer on the bottom gate electrode;
an active layer in a donut shape on the insulation layer, the active layer including a hole for channel separation at the center of the active layer, and wherein the donut shape is generally a square or rectangle having four outer corners;
an etch stop layer on the active layer, the etch stop layer including a first contact hole and a second contact hole, the first contact hole and the second contact hole being symmetrically disposed on two of the four outer corners, diagonally facing each other; and
an electrode layer on the etch stop layer corresponding to areas of edges of the active layer, the electrode layer including a source electrode and a drain electrode that bury the first contact hole and the second contact hole and are symmetrically disposed on the two of the four outer corners, and including a first top gate electrode and a second top gate electrode that are symmetrically disposed on two remaining corners of the four outer corners without physically contacting the source electrode and the drain electrode.

13. The TFT sensor as claimed in claim 12, wherein a direction of current flowing in separate channels is controlled by applying a periodically-swinging voltage to the first top gate electrode and the second top gate electrode.

14. The TFT sensor as claimed in claim 12, wherein the active layer includes an oxide semiconductor.

15. The TFT sensor as claimed in claim 14, wherein the active layer oxide semiconductor includes at least one material selected from the group of In, Ga, Zn, Sn, Sb, Ge, Hf, Al, and As.

16. A thin-film transistor (TFT) sensor array comprising:
TFT sensors arranged by rotating each of the TFT sensors by a predetermined angle from corresponding adjacent ones of the TFT sensors;
wherein each of the TFT sensors includes:
a bottom gate electrode on a substrate;
an insulation layer on the bottom gate electrode;
an active layer in a donut shape on the insulation layer, the active layer including a hole for channel separation at the center of the active layer, and wherein the donut shape is generally a square or rectangle having four outer corners;
an etch stop layer on the active layer, the etch stop layer including a first contact hole and a second contact hole, the first contact hole and the second contact holes being symmetrically disposed on two of the four outer corners, diagonally facing each other;
a source electrode and a drain electrode burying the first contact hole and the second contact holes, the source electrode and the drain electrodes being symmetrically disposed on the two of the four outer corners; and
a first top gate electrode and a second top gate electrode being symmetrically disposed on two remaining corners of the four outer corners without physically contacting the source electrode and the drain electrode.

17. The TFT sensor array as claimed in claim 16, comprising four of the TFT sensors, wherein the predetermined angle is 90 degrees.

* * * * *